United States Patent [19]
Lim

[11] Patent Number: 6,090,682
[45] Date of Patent: Jul. 18, 2000

[54] ISOLATION FILM OF SEMICONDUCTOR DEVICE AND METHOD FOR FABRICATING THE SAME COMPRISING A LOWER ISOLATION FILM WITH A UPPER ISOLATION FILM FORMED ON TOP

[75] Inventor: Jun Hee Lim, Seoul, Rep. of Korea

[73] Assignee: LG Semicon Co., Ltd., Chungcheongbuk-do, Rep. of Korea

[21] Appl. No.: 09/057,563

[22] Filed: Apr. 9, 1998

[30] Foreign Application Priority Data

Apr. 17, 1997 [KR] Rep. of Korea .................. 97-14257

[51] Int. Cl.[7] .............................. H01L 21/76; H01L 21/31
[52] U.S. Cl. ....................... 438/407; 438/407; 438/423; 438/410; 438/439; 438/449; 438/450; 438/769; 438/770
[58] Field of Search .................................. 438/439, 449, 438/450, 769, 770, 407, 423, 438, 410, 216, 287

[56] References Cited

U.S. PATENT DOCUMENTS 4,897,364  1/1990  Nguyen et al. .
5,316,965  5/1994  Philipossian et al. .
5,821,153  10/1998  Tsai et al. .

OTHER PUBLICATIONS

S. Wolf, "Silicon Processing for the VLSI Era", vol. 2, pp. 17–27.

Primary Examiner—John F. Niebling
Assistant Examiner—Ron Pompey

[57] ABSTRACT

Disclosed are an isolation film of a semiconductor device and a method for fabricating the same, which prevent the isolation film from being damaged due to misalignment when forming a contact hole in a region adjacent to the isolation film, to ensure stable effective isolation distance. The isolation film of a semiconductor device includes a semiconductor substrate, a lower isolation film formed in the semiconductor substrate, and an upper isolation film formed on the lower isolation film, with a material having etching selectivity different from the lower isolation film.

9 Claims, 5 Drawing Sheets

ISOLATION FILM OF SEMICONDUCTOR DEVICE AND METHOD FOR FABRICATING THE SAME COMPRISING A LOWER ISOLATION FILM WITH A UPPER ISOLATION FILM FORMED ON TOP

BACKGROUND OF THE INVENTION

1. Field of the Invention

The present invention relates to an isolation film of a semiconductor device and a method for fabricating the same, and more particularly, to an isolation film of a semiconductor device and a method for fabricating the same, which prevent the isolation film from being damaged due to misalignment when forming a contact hole in a region adjacent to the isolation film, to ensure stable effective isolation distance.

2. Discussion of the Related Art

Generally, in an integrated circuit, it is necessary to electrically isolate each device formed in a surface of a semiconductor substrate. In a bipolar device and a metal oxide semiconductor (MOS) device, a field oxide film is thickly formed so as not to cause undesirable short and punchthrough between adjacent devices, or impurity ion is implanted into the semiconductor substrate, in which a field oxide film will be formed, so as not to form a channel and then is diffused into substrate to substantially isolate the devices from one another.

With high packing density of the semiconductor device, methods for reducing the dimensions of a field region for isolation of devices and an active region for the formation of devices have been proposed. In general, local oxidation of silicon (LOCOS) process has been widely used in a method for forming a field region for isolation of devices due to its simple process steps and excellent reproduction.

A conventional method for forming an isolation film of a semiconductor device will be described with reference to the accompanying drawings.

FIGS. 1a to 1e are sectional views illustrating a conventional method for forming an isolation film of a semiconductor device.

As shown in Fig. 1a, an oxide film 2 and a nitride film 3 are sequentially formed on a semiconductor substrate 1. Subsequently, a field region F and an active region A are defined. The nitride film 3 and the oxide film 2 are then selectively patterned by photolithography and etching processes to expose the semiconductor substrate 1 in the field region F.

As shown in Fig. 1b, the exposed semiconductor substrate 1 is oxidized by LOCOS process to form a field oxide film 4. At this time, the field oxide film 4 is not formed on the nitride film 3 because oxygen is substantially not diffused into the nitride film 3.

As shown in Fig. 1c, the nitride film 3 and the oxide film 2 over the active region A are removed. Subsequently, a gate electrode (not shown) is formed on the semiconductor substrate 1 in which the active region A is defined. An impurity region 5, which will be used as source and drain, is then formed on the semiconductor substrate 1 at both sides of the gate electrode.

As shown in Fig. 1d, an interlevel oxide film 6 is formed on the entire surface of the impurity region 5 and the field oxide film 4. Subsequently, a contact hole (for example, a node contact hole or a via hole) region is defined and then the interlevel oxide film 6 in the contact hole region is selectively removed to form a contact hole 7. At this time, the field oxide film 4 having the same etching selectivity as the interlevel oxide film 6 is partially etched due to misalignment, which is likely caused by high packing density of the semiconductor device. It is thus noted that the width of the field region F is reduced to F'.

As shown in Fig. 1e, a conductive layer 8 is formed on the entire surface of the interlevel oxide film 6 including the contact hole 7. The conductive layer 8 is then selectively patterned to remain over the contact hole 7 and some portion of the interlevel oxide film 6 adjacent to the contact hole 7.

The conventional method for forming an isolation film of a semiconductor device has several problems.

Since the width of the field region defined before forming the semiconductor device is reduced to F' due to misalignment caused by high packing density of the semiconductor device, final effective isolation distance is shortened, thereby deteriorating reliability of the field region. To solve such a problem, it is necessary to widen the width of the effective isolation distance. However, this is contrary to achieving high packing density of the semiconductor device.

SUMMARY OF THE INVENTION

Accordingly, the present invention is directed to an isolation film of a semiconductor device and a method for forming the same that substantially obviates one or more of the problems due to limitations and disadvantages of the related art.

An object of the present invention is to provide an isolation film of a semiconductor device and a method for fabricating the same, in which an upper portion of the isolation film is formed of a material having etching selectivity different from an interlevel insulating film so as to prevent the isolation film from being damaged during etching process for forming a contact hole, thereby ensuring stable effective isolation distance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an isolation film of a semiconductor device according to the present invention includes a semiconductor substrate, a lower isolation film formed in the semiconductor substrate, and an upper isolation film formed on the lower isolation film, with a material having etching selectivity different from the lower isolation film.

In another aspect, a method for forming an isolation film of a semiconductor device according to the present invention includes the steps of preparing a semiconductor substrate, forming a lower isolation film in the semiconductor substrate, and forming an upper isolation film having etching selectivity different from the lower isolation film on a surface of the lower isolation film by ion implantation and annealing.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
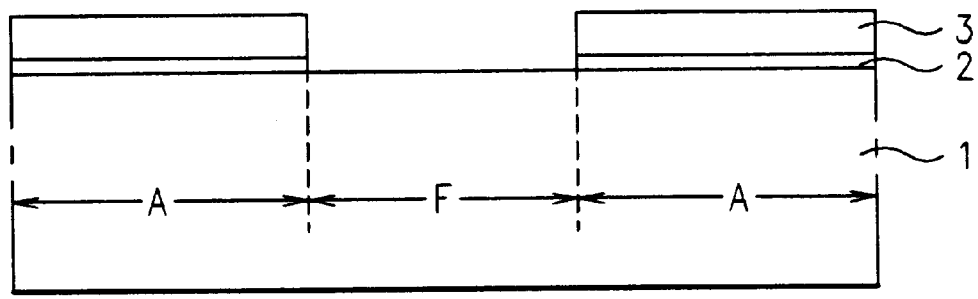
Figs. 1a to 1e are sectional views illustrating a conventional method for forming an isolation film of a semiconductor device.
Figure 1B:
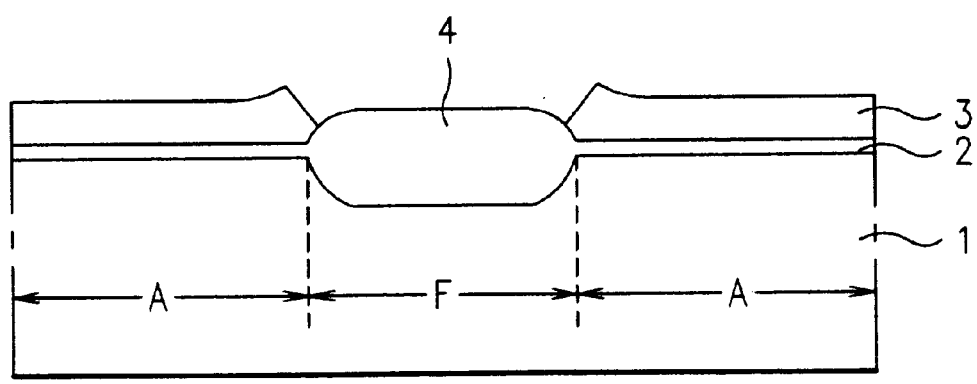
Figure 1C:
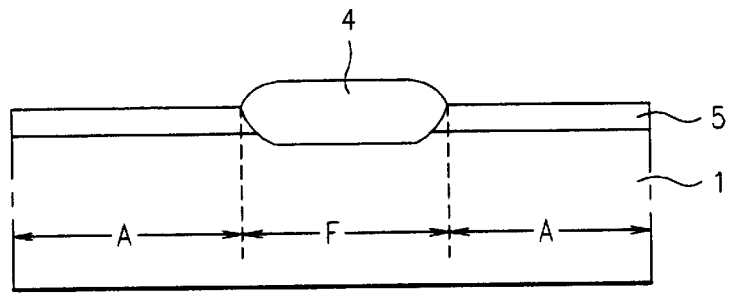
Figure 1D:
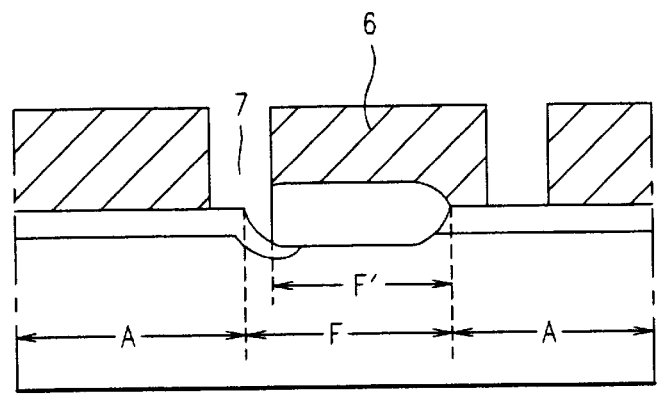
Figure 1E:
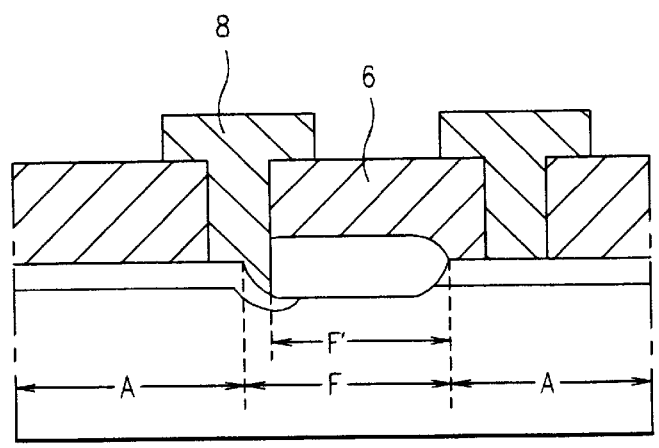
Figure 2:
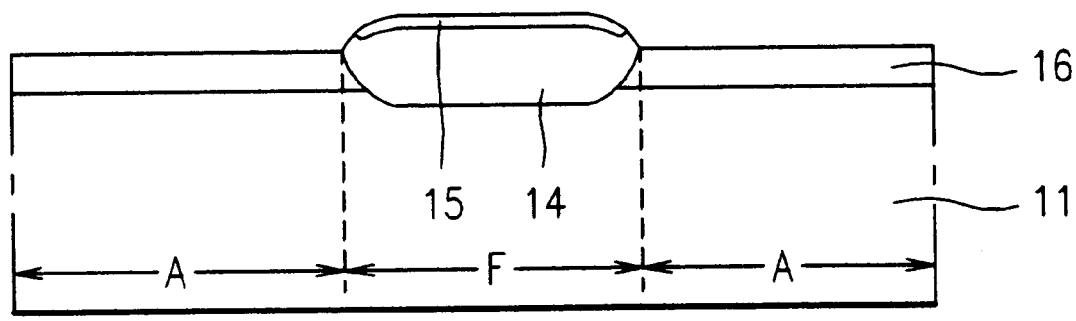
FIG. 2 is a sectional view illustrating an isolation film of a semiconductor device according to the present invention.

As shown in FIG. 2, an isolation film of a semiconductor device according to the present invention includes a semiconductor substrate 11, a lower isolation film 14 formed in the semiconductor substrate 11, and an upper isolation film 15 formed on the lower isolation film 14, with a material having etching selectivity different from the lower isolation film 12.

A field region F and an active region A are defined in the semiconductor substrate 11. The lower isolation film 14 and the upper isolation film 15 are formed in the field region F of the semiconductor substrate 11. The lower isolation film 14 is formed of an oxide film. The upper isolation film 15 is formed of a nitride film.

The upper isolation film 15 of the nitride film is formed by doping nitrogen ions on the lower isolation film 14. Desirably, the upper isolation film 15 is formed of a nitrated isolation film ($Si_xN_yO_z$).

A method for forming the isolation film of the semiconductor device according to the present invention and a method for forming a contact hole using the isolation film will be described with reference to FIGS. 3a to 3f.

Figure 3A:
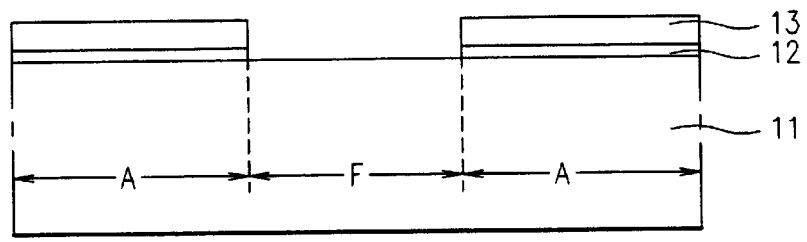
FIGS. 3a to 3f are sectional views illustrating a method for forming an isolation film of a semiconductor device and a method for forming a contact hole using the isolation film, according to the present invention.

As shown in FIG. 3a, an oxide film 12 and a nitride film 13 are sequentially formed on a semiconductor substrate 11. Subsequently, a field region F and an active region A are defined and then the nitride film 13 and the oxide film 12 are selectively patterned by photolithography and etching process to expose the semiconductor substrate 11 in the field region F.

Figure 3B:
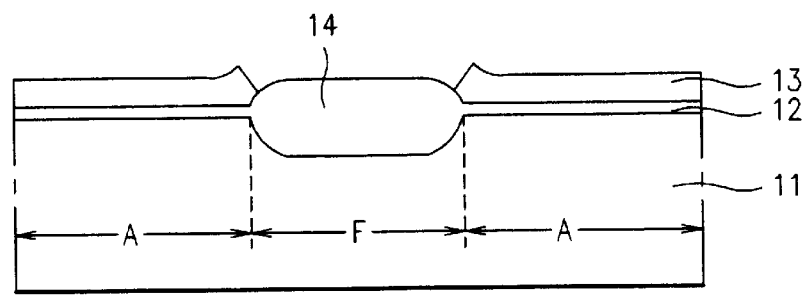

As shown in FIG. 3b, the exposed semiconductor substrate 11 is annealed in the ambient of 02 to form a lower isolation film 14 as a field oxide film in the field region F. At this time, the field oxide film is not formed on the nitride film 13 because an oxygen ion is substantially not diffused into the nitride film 13.

Figure 3C:
Figure 3C:
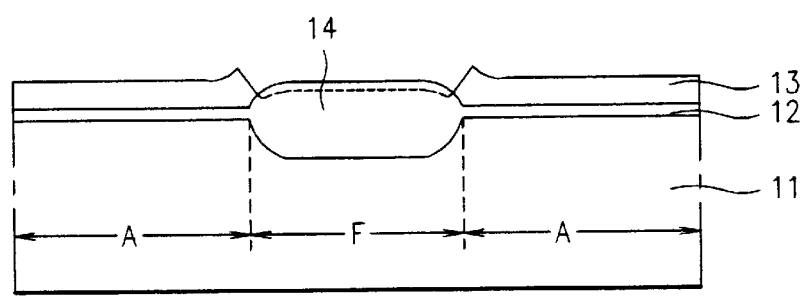

As shown in FIG. 3c, nitrogen ions are implanted into the entire surface of the nitride film 13 and the lower isolation film 14 at a thickness of $10^{14} \sim 10^{17}/cm^2$ to a depth of 10~50% of the lower isolation film 14.

Figure 3D:
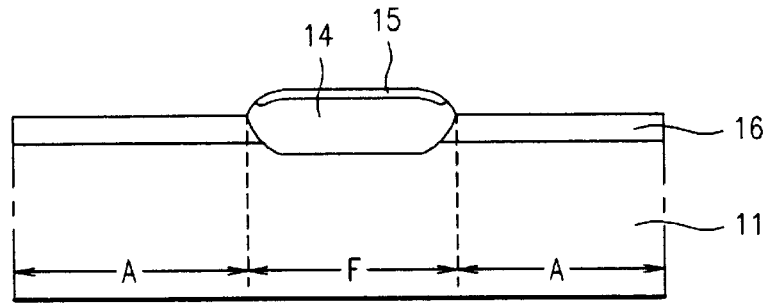

As shown in FIG. 3d, the nitride film 13 and the oxide film 12 are removed. Subsequently, the semiconductor substrate 11 is annealed for 20~40 minutes at a temperature of 900° C. or more (desirably, 900~950° C.) to form an upper isolation film 15 of a nitride film on an upper surface of the lower isolation film 14. Thus, the method for forming the isolation film of the semiconductor device according to the present invention is completed. At this time, the upper isolation film 15 is formed of a nitrated isolation film ($Si_xN_yO_z$) with etching selectivity different from the lower isolation film 14 by implanting the nitrogen ions into the lower isolation film 14 of the field oxide film.

Figure 3E:
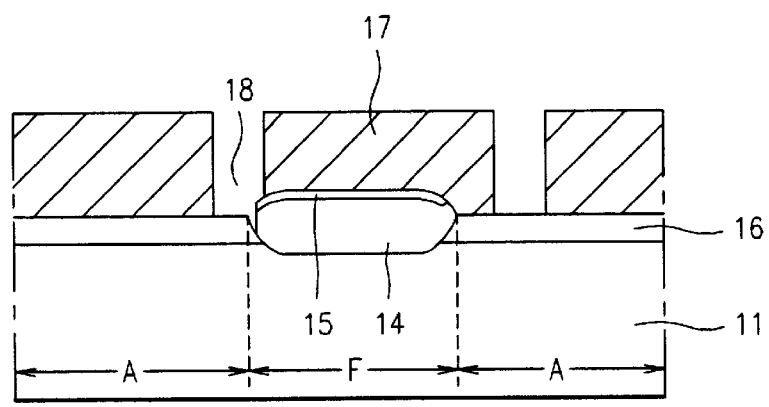

As shown in FIG. 3e, a gate electrode (not shown) is selectively formed on the active region A of the semiconductor substrate 11. An impurity region 16, which will be used as source and drain, is then formed on the semiconductor substrate 11 at both sides of the gate electrode. Subsequently, an interlevel oxide film 17 is formed on the entire surface of the impurity region 16 and the lower isolation film 14. A contact hole (for example, a node contact hole or a bitline contact hole) region is defined and then the interlevel oxide film 17 in the contact hole region is selectively patterned by lithography and etching process to form a contact hole 18. At this time, since the upper isolation film 15 is formed of a nitrated isolation film ($Si_xN_yO_z$), the upper isolation film 15 has etching selectivity different from the interlevel oxide film 17. For this reason, when forming the contact hole 18, the lower isolation film 14 is not etched in spite of misalignment which is likely caused by high packing density of the semiconductor device. It is thus noted that the width of the field region F is not significantly reduced.

Figure 3F:
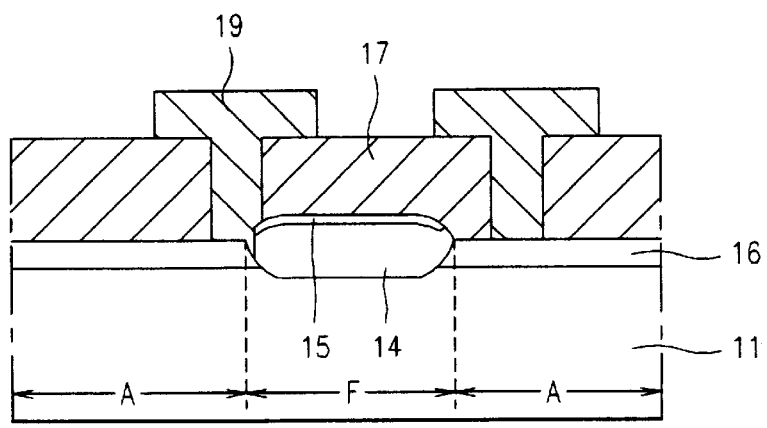

As shown in FIG. 3f, a conductive layer 19 is formed on the entire surface of the interlevel oxide film 17 including the contact hole 18. The conductive layer 19 is then selectively patterned to remain over the contact hole 18 and some portion of the interlevel oxide film 17 adjacent to the contact hole 18.

The upper isolation film 15 is generally formed by LOCOS process. Alternatively, the upper isolation film 15 is formed by shallow trench isolation (STI) process.

The isolation film of the semiconductor device according to the present invention and the method for forming the isolation film have the following advantages.

Since the nitrated isolation film ($Si_xN_yO_z$), having etching selectivity different from the interlevel oxide film, is formed on the field oxide film, it is possible to ensure stable effective isolation distance even if misalignment occurs due to high packing density of the semiconductor device when forming the contact hole, thereby improving reliability of the isolation film of the semiconductor device and the method for forming the same.

It will be apparent to those skilled in the art that various modifications and variations can be made in the isolation film of the semiconductor device and the method for forming the same according to the present invention without departing from the spirit or scope of the invention. Thus, it is intended that the present invention covers the modifications and variations of the invention provided they come within the scope of the appended claims and their equivalents.

What is claimed is:

1. A method for forming an isolation film of a semiconductor device comprising the steps of:

preparing a semiconductor substrate;

forming a lower isolation film in the semiconductor substrate; and forming an upper isolation film having etching selectivity different from the lower isolation film on a surface of the lower isolation film by ion implantation and annealing.

2. The method as claimed in claim 1, wherein the ion is a nitrogen ion.

3. The method as claimed in claim 2, wherein the nitrogen ion is implanted into the lower isolation film at a thickness of $10^{14} \sim 10^{17}/cm^2$.

4. The method as claimed in claim 3, wherein the nitrogen ion is implanted into the lower isolation film at a depth of 10 ~50% of the lower isolation film.

5. The method as claimed in claim 1, wherein the annealing is performed at a temperature of 900° C. or more.

6. The method as claimed in claim 1, wherein the annealing is performed for 20~40 minutes.

7. The method as claimed in claim 1, wherein the lower isolation film is formed of an oxide film and the upper isolation film is formed of a nitride film.

8. The method as claimed in claim 7, wherein the nitride film is formed of a nitrated isolation film.

9. The method as claimed in claim 8, wherein the nitrated isolation film is formed of $Si_xN_yO_z$.

* * * * *